US006433431B1

(12) United States Patent
Farrar

(10) Patent No.: US 6,433,431 B1
(45) Date of Patent: Aug. 13, 2002

(54) COATING OF COPPER AND SILVER AIR BRIDGE STRUCTURES

(75) Inventor: Paul A. Farrar, South Burlington, VT (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 09/651,750

(22) Filed: Aug. 30, 2000

(51) Int. Cl.[7] ................................................ H01L 23/48
(52) U.S. Cl. ........................ 257/758; 257/735; 257/773
(58) Field of Search ................................ 438/619, 653, 438/670, 687, 686, 411; 257/758, 759, 735, 773, 776

(56) References Cited

U.S. PATENT DOCUMENTS 5,994,777 A 11/1999 Farrar ........................ 257/758
6,184,053 B1 * 2/2001 Eldridge et al. .............. 438/52
6,097,092 A1 * 8/2001 Natzle ........................ 257/758
6,294,455 B1 * 9/2001 Ahn ........................... 438/619

* cited by examiner

*Primary Examiner*—Caridad Everhart
(74) *Attorney, Agent, or Firm*—Knobbe, Martens Olson & Bear, LLP

(57) ABSTRACT

An improved electrical interconnect for an integrated circuit and methods for providing the same are disclosed. The interconnect includes an air bridge extending through an air space so as to reduce the capacitance of the interconnect. The air bridge is supported at a first and second end such that a midpoint of the air bridge sags as a result of gravitational forces acting on the air bridge. The air bridge includes a inner core section comprising a highly conductive material, such as silver, so as to provide the air bridge with a reduced resistance. In one embodiment, the material of the core comprises copper so that the core has a reduced ratio of mass density over modulus of elasticity (ρ/E) which provides the air bridge with a reduced degree of sagging. To inhibit air from contaminating the core, the air bridge further comprises a protective coating interposed between the core and the air space. The protective coating can either comprise a conducting material or an insulating material and can be deposited using conventional deposition processes.

20 Claims, 7 Drawing Sheets

30
62
52
56
54
40
58
62
50
52
52
34
60
42
44
32

COATING OF COPPER AND SILVER AIR BRIDGE STRUCTURES

BACKGROUND OF THE INVENTION

1. Field of the Invention

The present invention relates to integrated circuits and, in particular, relates to miniaturized electrical interconnects having reduced resistance and capacitance.

2. Description of the Related Art

To provide improved performance, manufacturers of integrated circuit devices continually strive to increase circuit density. Such devices are typically formed on a semiconductor substrate, such as a silicon wafer, and comprise a large number of miniaturized circuit elements. These elements, which include transistors, diodes, capacitors, and resistors, are usually disposed within or adjacent the substrate and define a plurality of circuit nodes. To combine the circuit elements into a useful electronic circuit, integrated circuit devices typically include a plurality of conducting paths that link the circuit nodes in a preferred manner. Typically, the conducting paths are provided by electrical interconnects comprising metallic wires including, for example, wires made of aluminum or aluminum alloy that are embedded in an insulating layer such as a layer of insulating $SiO_2$.

However, as circuit density is increased, problems associated with conventional electrical interconnects are becoming more apparent. In particular, a higher density device having an increased number of circuit elements will likely require an even greater increase in the number of electrical interconnects. Consequently, the electrical interconnects will need to have a reduced thickness and adjacent interconnects will need to be spaced more closely together.

Unfortunately, such dimensional reductions tend to increase the resistance of individual interconnects and increase the capacitance between adjacent interconnects, thereby possibly increasing signal propagation delays and signal cross-talk. In particular, electrically charged adjacent conductors acts as the plates of the capacitors. As the distance between adjacent conductors decrease, the resulting capacitance increases. This resulting increase in capacitance slows propagation of signals as the capacitance must be overcome prior to propagation of the signal along the conductor. Hence, while it is desirable to increase device density on integrated circuits, considerations such as these pose problems for maintaining or improving circuit performance.

To improve the conductivity of interconnects, it has been suggested that copper metallurgy be substituted for the aluminum metallurgy that is now typically being used. Advantageously, copper metallurgy interconnects are viewed as having increased conductivity and thus less resistance. The lower resistance of interconnects of this metallurgy could allow the use of smaller dimensions of interconnects thereby facilitating the increase of device density on the integrated circuit. However, several potential problems have been encountered in the development of this proposed metallurgy. One of the main ones being the fast diffusion of copper through both silicon and $SiO_2$. Fast diffusion of copper into silicon or silicon oxide results in diffusion of the conductive interconnect into the surrounding materials which can damage device performance or can result in short circuits occurring between adjacent interconnects.

To decrease capacitive loading, it has been suggested that the interconnects could be embedded in a solid insulating medium other than $SiO_2$, such as a polymer comprising fluorinated polymide. However, as in the case of $SiO_2$, an incompatibility problem with copper metallurgy has been found. In the case of polyimide, and many other polymers, it has been found that the polymer, during the curing, reacts with copper forming a conductive oxide $CuO_2$, which is dispersed within the polymer. This then raises the effective dielectric constant of the polymer and in many cases increases its conductivity. Hence, there have been numerous suggested approaches towards solving the problems of capacitive coupling and increased resistance occurring as a result of a need to formulate smaller dimensioned interconnects that are spaced closer together. A primary difficulty that results is the relative incompatibility of lower resistance materials with the surrounding insulating material.

Silver is the ultimate conductor, in that it has the lowest specific resistivity of any metal or alloy. Furthermore, a vacuum is the ultimate dielectric, with air being nearly as good. However, the use of a vacuum introduces additional problems or complexities to the device. The first being the low heat conductivity of the vacuum and the second being the cost of the package required to maintain the vacuum. Air, which has somewhat better thermal conductivity, has its own problems in that both copper and silver react with air to form oxides or other compounds. Alternatively, gold is known to be quite environmentally stable. However it's specific resistivity is higher than that of copper and silver.

To address the problem of increased capacitance, interconnects comprising an air bridge have been developed as described in U.S. Pat. No. 5,891,797. The air bridge is a length of conducting material that extends from a first supported end to a second supported end through an air space such that the bridge is substantially surrounded by air. Consequently, because air has a dielectric constant that is substantially less than that of SiO2, the capacitance between adjacent interconnects is reduced.

However, because the air bridge tends to sag under its own weight, the length of the air bridge is a possible limiting factor. In particular, because the air bridge is only supported at its first and second ends, gravitational forces acting on the air bridge when the bridge is horizontally disposed cause the air bridge to sag such that the unsupported middle of the air bridge is deflected downward with respect to the first and second ends. Because the degree of sagging increases as the length of the bridge is increased, the length of the air bridge cannot exceed that which would cause the air bridge to break or come into contact with another conductor of the device.

According to classical mechanics for simple air bridge structures, the center of the bridge is deflected downward with respect to the supported and constrained ends by an amount δ given by $$\delta = \frac{\rho L^4}{32h^2E},$$

wherein ρ is the mass per unit volume of the air bridge, L is the length of the air bridge, h is the height of the air bridge, and E is the modulus of elasticity of the air bridge. Consequently, aside from the geometric factors L and h, the deflection δ is proportional to the ratio of (ρ/E). Thus, an air bridge formed of a material having a reduced ratio of (ρ/E) will experience less sagging. If the ends of the bridge are not considered to be constrained then $$\delta = \frac{5}{32}\frac{\rho L^4}{h^2 E}.$$

This is the worst case assumption.

| Material | Resistivity (nΩm) | Elastic Modulus (GPa) | Mass Density (Mg/m3) | ρ/E |
|---|---|---|---|---|
| Copper | 16.7 | 128 | 8.93 | 0.0698 |
| Silver | 14.7 | 71 | 10.5 | 0.148 |
| Gold | 23.5 | 78 | 19.3 | 0.247 |
| Aluminum | 27.5 | 70 | 2.7 | 0.039 |

The table above illustrates the physical properties of possible air bridge materials. Both copper and silver have resistivities that are substantially less than that of aluminum and, thus, would provide air bridges with reduced resistance. Because copper has a ratio of (ρ/E) which is less than that of silver, a low resistance bridge comprising copper would experience less sagging and, thus, would be more suitable for applications that require bridges having extended lengths. Alternatively, because silver has a resistivity less than that of copper, a bridge comprising silver would be more suitable for applications that require reduced resistance. However, as was pointed out previously, both copper and silver are susceptible to environmental degradation in an air environment.

Gold also has a resistivity less than that of aluminum. Furthermore, gold is not susceptible to environmental degradation in an air environment. However, because the resistivity of gold and the ratio of (ρ/E) of gold are substantially larger those of silver or copper, a bridge formed of gold would have a relatively large resistance and would experience a relatively high degree of sagging.

From the foregoing, therefore, it will be appreciated that there is a need for an improved air bridge for an integrated circuit that not only provides a relatively small resistance but also is extendable over relatively large distances.

SUMMARY OF THE INVENTION

The aforementioned needs are satisfied by one aspect of the present invention which is an electrical interconnect of an integrated circuit for electrically connecting first and second nodes of the integrated circuit. The electrical interconnect comprises a bridge supported at a first and second end such that gravitational forces acting on the bridge cause the bridge to sag. The bridge is disposed adjacent a gaseous medium so as to reduce the capacitance of the interconnect. The bridge comprises a conductive core that includes a material which has a tendency to become contaminated by the gaseous medium. The bridge further comprises a protective coating covering a substantial portion of the core so as to inhibit the core from being contaminated by the gaseous medium.

In one embodiment, the conductive core comprises a material selected from the group comprising copper and silver. Because these materials have a resistivity less than that of conventional wiring materials, i.e. aluminum, the bridge is able to have a substantially reduced resistance. Furthermore, the protective coating can comprise either a conductive material or an insulating material.

In another aspect, the aforementioned needs are provided by an air bridge for electrically connecting first and second nodes of an integrated circuit. The air bridge comprises a core that provides a substantial portion of the air bridge. The core comprises a material selected to provide a reduced resistance and is disposed adjacent an air space comprising air so as to reduce the capacitance of the air bridge. The air bridge further comprises a protective coating substantially surrounding the core and interposed between the core and the air space. The protective coating inhibits air from the air space from diffusing through and contaminating the core.

In yet another aspect, the aforementioned needs are provided by an integrated circuit having a plurality of circuit nodes. The integrated circuit comprises a first interconnect that provides a first conducting path between first and second circuit nodes and comprises a first air bridge extending through an air space. The first air bridge comprises an inner core that includes a first material selected to provide the first air bridge with a resistance substantially less than that of aluminum and a mass density substantially less than that of gold. The first air bridge further comprises a protective coating that includes a second material selected to inhibit oxygen from diffusing therein.

The protective coating substantially surrounds the core and inhibits oxygen from the air space from contaminating the core. The integrated circuit further comprises a second interconnect providing a second conducting path between third and fourth circuit nodes. The second interconnect comprises a second air bridge which is substantially identical to the first air bridge and extends through the air space so that the second air bridge is disposed adjacent the first air bridge.

In still yet another aspect, a method of forming an electrical interconnect for electrically connecting first and second nodes of an integrated circuit is provided. The interconnect extends from a first supported end to a second supported end through a gaseous medium such that gravitational forces acting on an unsupported midsection of the electrical interconnect induce the unsupported midsection to sag with respect to the first and second supported ends of the interconnect. The method comprises forming a core section of the interconnect of a first conducting material selected to provide the core section with a reduced resistance. The method further comprises depositing a protective coating on a surface of the core section so as to inhibit the gaseous medium from reacting with the core section.

From the foregoing, it should be apparent that electrical interconnect of the present invention and methods of providing the same provide many advantages over interconnects known in the art. In particular, because the bridge section of the interconnect is disposed adjacent an air space instead of a solid insulating material, the bridge is provided a reduced capacitance. Furthermore, because the material of the core of the bridge is more conductive than that which is used in typical interconnects, the interconnect of the present invention can be formed with an increased length and a reduced cross-sectional area. Moreover, because the protective coating inhibits the air adjacent the core from contaminating the core, the core can comprise environmentally sensitive materials that provide improved conductive and mechanical properties. These and other objects and advantages of the present invention will become more apparent from the following description taken in conjunction with the accompanying drawings.

DETAILED DESCRIPTION OF THE PREFERRED EMBODIMENT

The illustrated embodiments of the present invention comprise a miniaturized electrical interconnect having improved operating characteristics and methods for providing the same. The electrical interconnect includes a bridge section surrounded by air, referred to hereinbelow as an "air bridge", so as to reduce the capacitance of the interconnect. Air bridges are also described in U.S. Pat. No. 5,891,797 which is incorporated herein by reference in its entirety. As will be described in greater detail below, air bridges formed in accordance with the various aspects of the present invention are provided with reduced resistance and a reduced tendency to sag, thereby enabling them to have a reduced cross-sectional area and to extend across larger distances.

Improved electrical interconnects formed according to the methods of the illustrated embodiments are particularly useful in the manufacture of ultra-high density integrated circuit devices, such as a Dynamic Random Access Memory (DRAM), a microprocessor, or a Digital Signal Processor (DSP). It should be understood, however, that the methods described hereinbelow could be used in any application or structure in which it is desirable to include improved miniaturized electrical interconnects. Furthermore, the methods of the present invention are particularly well-suited for providing improved electrical interconnects on or above a semiconductor substrate, such as a silicon wafer, or substrate assembly, referred to herein generally as "substrate," used in forming any of a number of conventional integrated circuits. It is to be understood that the methods of the present invention are not limited to integrated circuits formed on silicon wafers; rather, other types of wafers (e.g., gallium arsenide, etc.) can be used as well. Thus, the skilled artisan will find application for the processes and materials discussed below for any of a number of devices requiring improved electrical interconnects.

Figure 1:
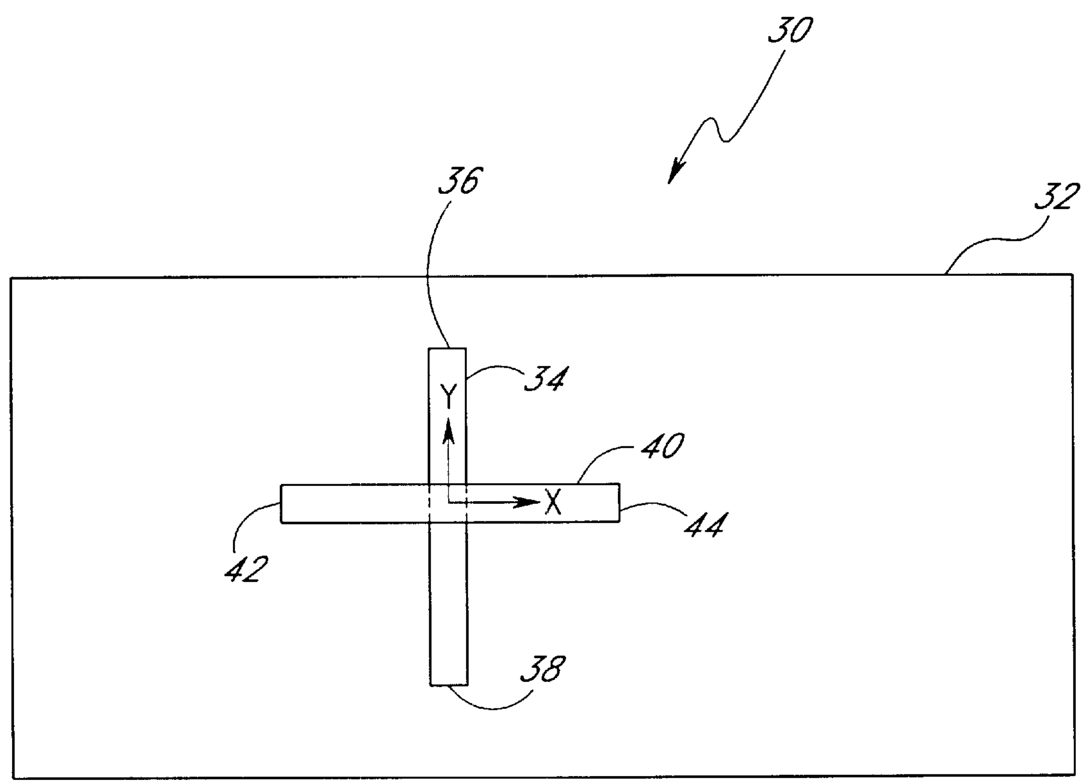
FIG. 1 is a schematic diagram of an integrated circuit device according to one aspect of the present invention, the device comprising at least one electrical interconnect having an air bridge structure.

Reference will now be made to the drawings wherein like numerals refer to like parts throughout. FIG. 1 schematically illustrates an integrated circuit device 30 according to one aspect of the present invention. The integrated circuit 30 comprises a plurality of known circuit components, such as transistors, resistors, capacitors and the like, formed in a well known manner. The circuit components are formed within, on, or above a substrate 32. In one embodiment, the substrate 32 has a planar shape and is aligned in an x-y plane as shown in FIG. 1. The circuit components define a plurality of circuit nodes which are interconnected by way of a plurality of improved electrical interconnects as will be described in greater detail below.

As schematically illustrated in FIG. 1, the integrated circuit comprises a first electrical interconnect 34 extending from a first node 36 to a second node 38 of the integrated circuit 30. The first interconnect 34 has an elongate shape which is shown extending in a linear manner along the y-axis. However, it will be appreciated that, in another embodiment, the first interconnect 30 could have a different shape and extend in a non-linear manner along virtually any direction with respect to the substrate. In one embodiment, the integrated circuit 30 further comprises a substantially similar second electrical interconnect 40 extending along the x-axis from a third node 42 to a fourth node 44 such that the second interconnect 40 overlaps the first interconnect 34 as shown in FIG. 1. While the nodes 36, 38, 42 and 44 are described in this embodiment as being positioned within the substrate 32, it will be appreciated by a person of ordinary skill that the nodes can actually be formed in an insulating layer positioned over the substrate 32. Hence, the use of the bridge structures described herein should not be viewed as being limited to use with nodes formed in the substrate as they can be used between nodes formed in or above the substrate 32.

Figure 2:
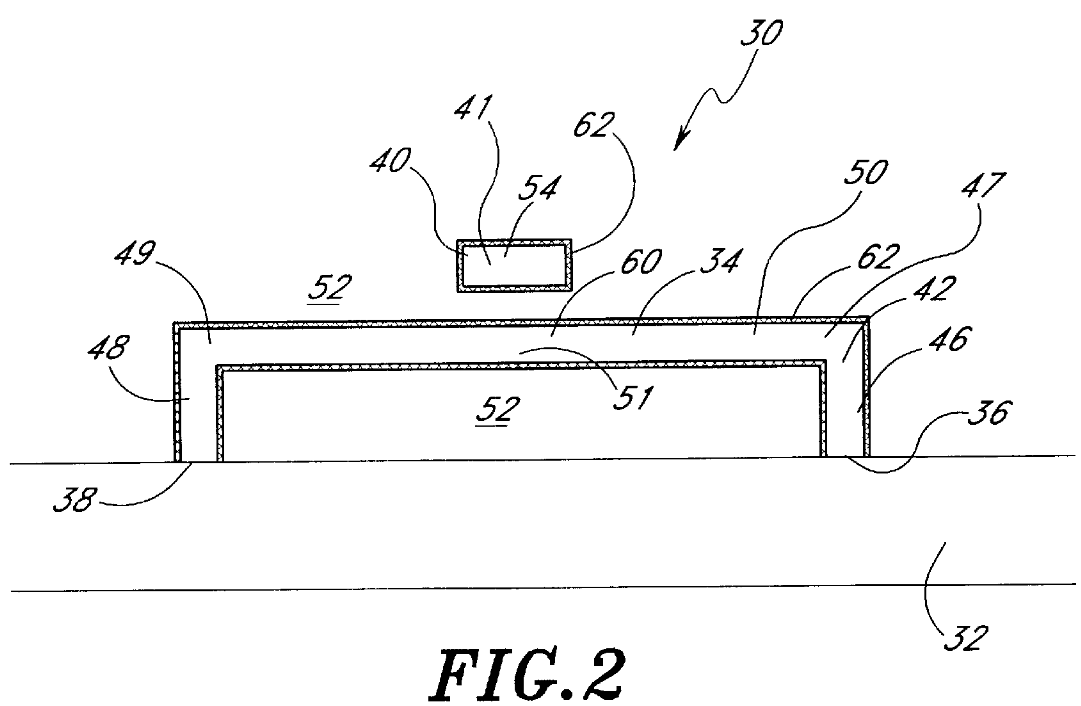
FIG. 2 is a cross-sectional schematic diagram of the air bridge of FIG. 1 as seen along a y-axis.
Figure 3:
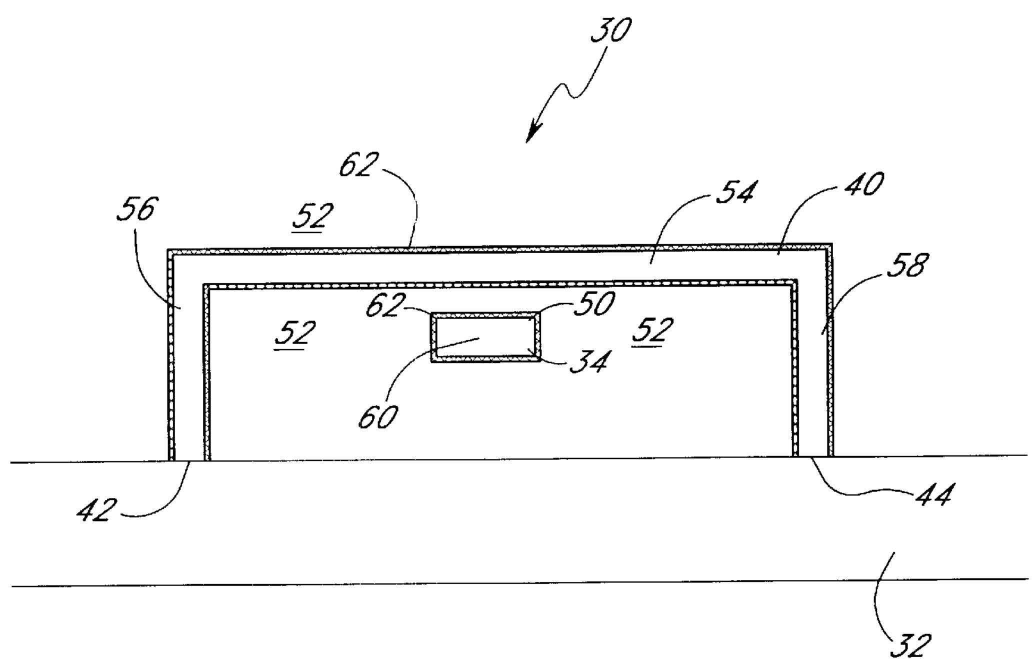
FIG. 3 is a cross-sectional schematic diagram of the air bridge of FIG. 1 as seen along an x-axis.

FIGS. 2 and 3 further illustrate the integrated circuit 30 of FIG. 1, wherein FIG. 2 is a schematic diagram corresponding to a view along the x-axis and FIG. 3 is a schematic diagram corresponding to a view along the y-axis. The first interconnect 34 comprises a first end section 46 extending from the first node 36, a second end section 48 extending from the second node 38, and a bridge section 50 extending between the first and second end sections 46 and 48. The first end section 46 supports a first end 47 of the bridge section 50 and the second end section 48 supports a second end 49 of the bridge section 50. Consequently, gravitational forces acting on the bridge section 50 cause an unsupported midpoint 51 of the bridge section 50 to sag such that the midpoint 51 is downwardly displaced with respect to the ends 47 and 49. As will be described in greater detail below, in one embodiment, the bridge section 50 comprises a material having a reduced ratio of mass density over modulus of elasticity ($\rho/E$) so as to reduce the degree of sagging.

The end sections 46 and 48 and the bridge section 50 comprise a conducting material that provides a conducting path extending between the first and second nodes 36 and 38. Furthermore, the bridge section 50 is disposed in a plane that is outwardly displaced from the plane of the substrate. Moreover, the bridge 50 extends through a space 52 having a gaseous medium disposed therein such that the bridge section 50 is substantially surrounded by the gaseous medium. In the preferred embodiment, the gaseous medium comprises air or any other low dielectric gaseous mixtures. Consequently, because air has a relatively small dielectric constant, the first interconnect 34 is provided with a relatively small capacitance with respect to nearby conducting elements of the device.

In one embodiment, the first and second end sections 46 and 48 laterally extend from the respective first and second nodes 36 and 38 and the bridge section 50 longitudinally extends therebetween. However, a person skilled in the art will realize that the methods described herein could also be used to form interconnects having an alternative geometry. For example, the end sections could extend from the nodes 36 and 38 with longitudinal components and the bridge section could extend with a lateral component. Furthermore, rather than extending along a plane disposed away the substrate, in another embodiment, the bridge section could extend through a trench formed within the substrate such that the bridge section substantially overlaps the plane of the substrate. Moreover, in yet another embodiment, the electrical interconnect could consist solely of the bridge section such that the bridge section extends directly from the first node to the second node through the trench formed in the substrate or in an insulating layer formed on the substrate.

In one embodiment, the second interconnect 40 comprises a second air bridge 54 which is substantially similar to the air bridge 50 of the first interconnect 34. As shown in FIGS. 2 and 3, the second air bridge extends between laterally disposed first and second end sections 56 and 58 through the air space 52 such that the second bridge 54 is disposed above the first air bridge 50. Thus, because air separates the first and second air bridges 50 and 54, the capacitance between the first and second interconnects 34 and 40 is reduced. Consequently, independent signals propagating along the first and second interconnects 34 and 40 are less likely to interfere with each other and the speed of propagation of signals will be less effected by capacitance.

As shown in FIGS. 2 and 3, the air bridge 50 comprises a core 60 extending along its length that provides the air bridge 50 with desirable electrical and mechanical properties. In particular, to promote conduction along it length, the core 60 preferably comprises a highly conductive material. Furthermore, to reduce sagging, the core 60 preferably comprises a material having a relatively small ratio of mass density over modulus of elasticity ($\rho/E$). As mentioned above in the background section, materials having relatively low resistivity and relatively low $\rho/E$ include copper and silver. In one embodiment, the core 60 comprises copper. In another embodiment, the core 60 comprises silver.

As shown in FIGS. 2 and 3, the air bridge 50 further comprises a protective coating 62 that is deposited on the core 60 and substantially surrounds the core 60 such that the coating 62 is interposed between the core 60 and the air of the air space 52. The purpose of the coating 62 is to provide the air bridge 50 with desirable environmental properties. In particular, the coating 62 acts as a barrier which inhibits contaminants, such as oxygen, from reaching the core 60. Furthermore, the coating 62 preferably comprises a material having a low solubility with respect to the core 60 that does not readily diffuse into the core and significantly degrade the conductivity of the core 60. Thus, because the core 60 is substantially shielded from the air space 52, the core 60 is able to include environmentally sensitive materials, such as copper or silver, that provide the bridge 50 with reduced resistance and reduced sagging.

In one embodiment, the coating 62 comprises a conducting material, that resists air molecules from diffusing therethrough and enhances conduction along the bridge 50. For example, the coating can include the noble metals gold, platinum, palladium, iridium or the reactive elements titanium, zirconium or hafnium. If one of the reactive elements is used, zirconium may be preferred due to its low solubility in both copper and silver.

In one embodiment, the coating 62 comprises an insulating material that inhibits air molecules from reaching the core 60. For example, the coating 62 could comprise an organic material such as parylene, or an organic material such as $Si_3N_4$.

Figure 4:
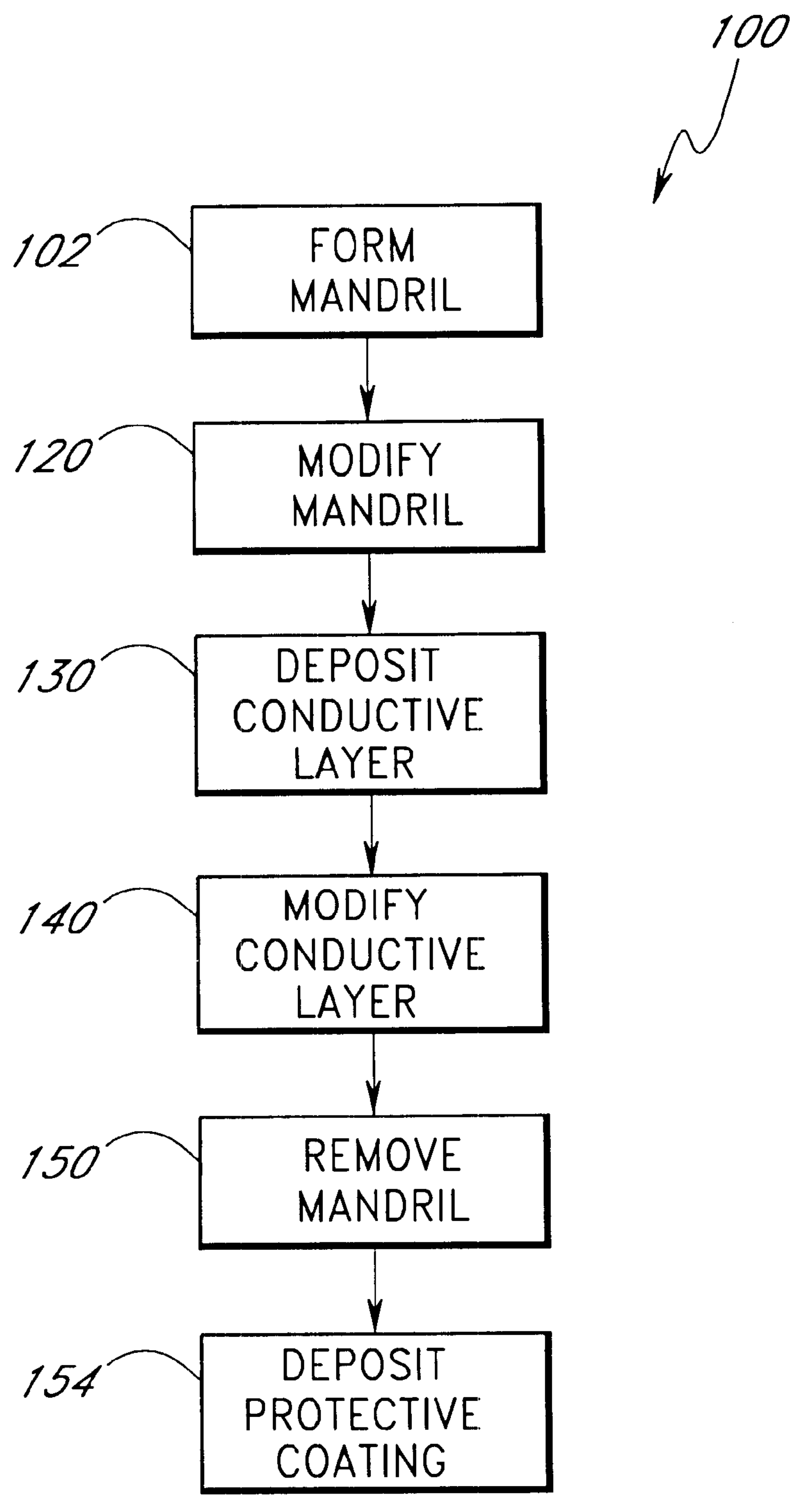
FIG. 4 is a flow chart illustrating one embodiment of a method of forming the electrical interconnect of FIG. 1.
Figure 5:
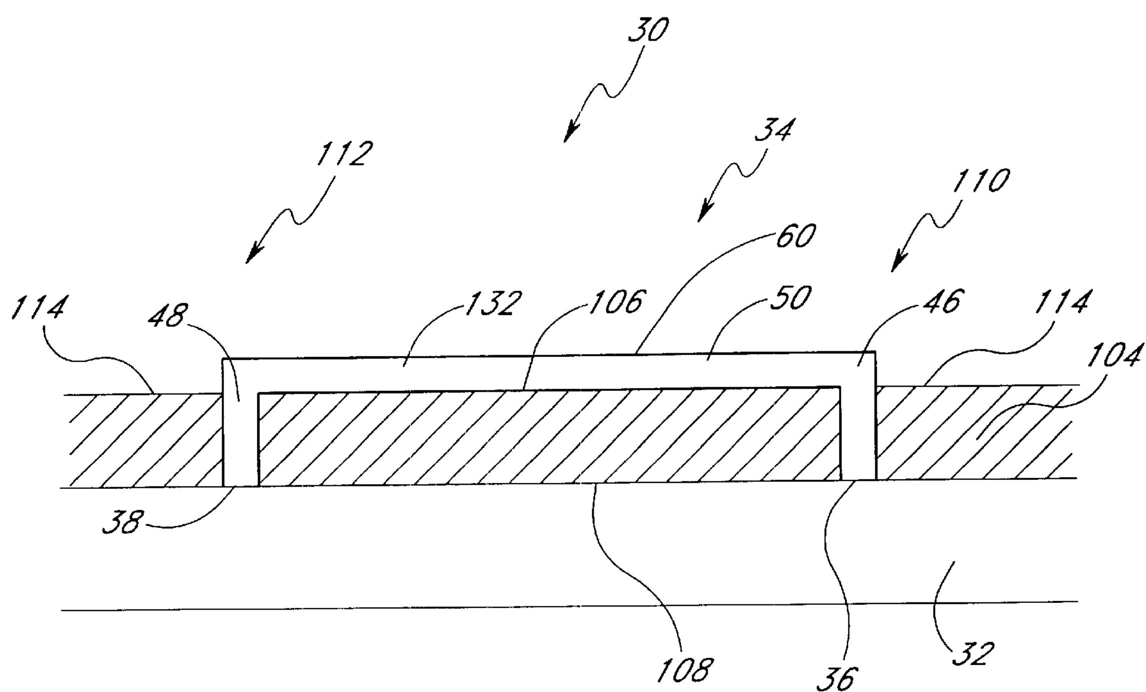
FIGS. 5 is a cross-sectional schematic diagram illustrating the electrical interconnect of FIG. 1 in a partially fabricated state according to the method of FIG. 4.

Reference will now be made to FIGS. 4–5 which illustrate a method 100 of forming an individual electrical interconnect according to one embodiment of the present invention. As will be described in greater detail below, the method 100 essentially comprises forming the core 60 of the interconnect 34 and then disposing the coating 62 on the core 60.

As shown in FIG. 4, in one embodiment, the method 100 comprises, in a state 102, forming a temporarily support structure or mandril. The purpose of the mandril is to provide a supporting surface that supports the bridge section of the electrical interconnect during formation of the bridge section. The mandril can be formed from any of a wide variety of materials that provide the electrical interconnect with temporary support and that can subsequently be removed to expose a lower surface of the air bridge section.

For example, as shown in FIG. 5, the temporary support structure may comprise a layer 104 of photoresist which is deposited over the substrate 32 using conventional deposition techniques. The photoresist layer 104 is deposited with a substantially uniform thickness such that the substrate 32 is substantially covered by the layer 104 and the first and second nodes 36 and 38 are disposed under the layer 104. The thickness of the layer 104 is selected so as to provide a desired separation distance between a lower surface 106 of the bridge 50 and an upper surface 108 of the substrate 32.

As shown in FIG. 4, the method 100 further comprises, in a state 120, modifying the mandril so as to expose the first and second nodes 36 and 38. In particular, using conventional etching techniques, first and second vias 110 and 112 are formed in the mandril that vertically extend from an upper surface 114 of the mandrill 104 to the respective first and second nodes 36 and 38 of the circuit 30 as shown in FIG. 5.

As shown in FIGS. 4 and 5, the method 100 further comprises, in a state 130, depositing a conducting layer 132 over the mandril 104 such that the conducting layer 132 horizontally extends across the upper surface 114 of the mandril between the vias 110 and 112, so as to subsequently form the core 60 of the bridge 50, and vertically extends through the vias 110 and contact the first and second nodes 36 and 38 so as to provide the end sections 46 and 48 of the interconnect 34. Because the conducting layer 132 will eventually become the core 60 of the first electrical interconnect 34, the conducting layer 132 preferably comprises a highly conductive material having a relatively small ratio of ($\rho/E$), such as silver or copper, thereby providing the electrical interconnect 34 with a relatively small resistance and a reduced tendency to sag as will be described in greater detail hereinbelow.

As shown in FIGS. 4 and 5, the method 100 further comprises, in a state 140, modifying the conductive layer so as to define the shape of the core 60 of the electrical interconnect 34. For example, the core 60 can be shaped by employing conventional pattern and etching processes that leave behind the first and second end sections 46 and 48 vertically extending from the respective nodes 36 and 38 and also leave behind the bridge section 50 horizontally extending between the end sections 46 and 48 as shown in FIG. 5.

However, it will be appreciated that the core 60 of the interconnect 34 could be formed in an alternative manner without departing from the spirit of the present invention. For example, in an alternative embodiment, the core 60 could be formed by defining a trench in the mandril, depositing conductive material in the trench, and removing excess conductive material using a conventional chemical mechanical planarization process.

As shown in FIG. 4, the method 100 further comprises, in a state 150, removing the mandril so as to expose the lower surface 106 of the core. In one embodiment, the photoresist layer 104 is removed by exposing the photoresist layer 104 to a known etchant that selectively removes the photoresist 104 layer and does not remove the core 60 of the interconnect 34.

As shown in FIG. 4, the method 100 further comprises, in a state 154, disposing the protective coating 62 on the exposed surfaces of the core 60 of the electrical interconnect 34. In one embodiment, disposing the protective coating 62 comprises depositing a layer of conductive material selected from the group comprising the noble metals gold, platinum, palladium, iridium, and the reactive elements titanium, zirconium and hafnium. Furthermore, the conductive material of the coating 62 can be deposited using a known electroless plating process, or a known chemical vapor deposition process (CVD), such as Plasma Enhanced Chemical Vapor Deposition (PECVD).

In one embodiment, disposing the coating 62 comprises depositing an insulating material. For example, the insulating material can comprise an organic material, such as parylene, which can be deposited using a known vapor deposition polymerization process. Alternatively, the insulating material can comprise an inorganic material, such as $Si_3N_4$, which can be deposited using PECVD. If diffusion of the coating 62 into the core 60 is a concern, such diffusion can be reduced by not exposing the bridge 50 to elevated temperatures. Preferably, the conductive material is deposited so that the material only deposits on the core 60.

In one embodiment, the bridge section 50 of the first interconnect 34 has a rectangular cross-sectional shape with a width approximately equal to 0.25 microns and a height approximately equal to 0.25 microns. Consequently, the bridge section 50 comprising the copper core 60 is able to span a distance of 0.25 mm with a worst case sagging deflection approximately equal to 0.0065 microns. Furthermore, at this length, the bridge section 50 provides a resistance of only 67 ohms. Alternatively, if the core 60 is formed of silver, the bridge section 50 has a resistance approximately equal to 59 ohms and a sagging deflection approximately equal to 0.014 microns. In comparison, a similarly shaped aluminum bridge section would provide a substantially larger resistance approximately equal to 110 ohms and experience a sagging deflection approximately equal to 0.0035 microns.

As can be seen from the above example the limiting factor for Long Aluminum Bridge Structures is the line resistivity not the tendency to sag. If 50 ohms were the limit then Copper and Silver would both be marginally acceptable at this dimension while Aluminum would be unacceptable.

Preferably, the coating 62 has a thickness that substantially inhibits contaminants, such as oxygen, residing in the air space 52 from reaching the core. For example, in one embodiment, the coating 62 including one of the conducting materials listed above has a thickness approximately between 20 Å and 40 Å. In another embodiment, the coating 62 including one of the insulating materials listed above and has a thickness approximately between 10 Å and 100 Å.

Figure 6:
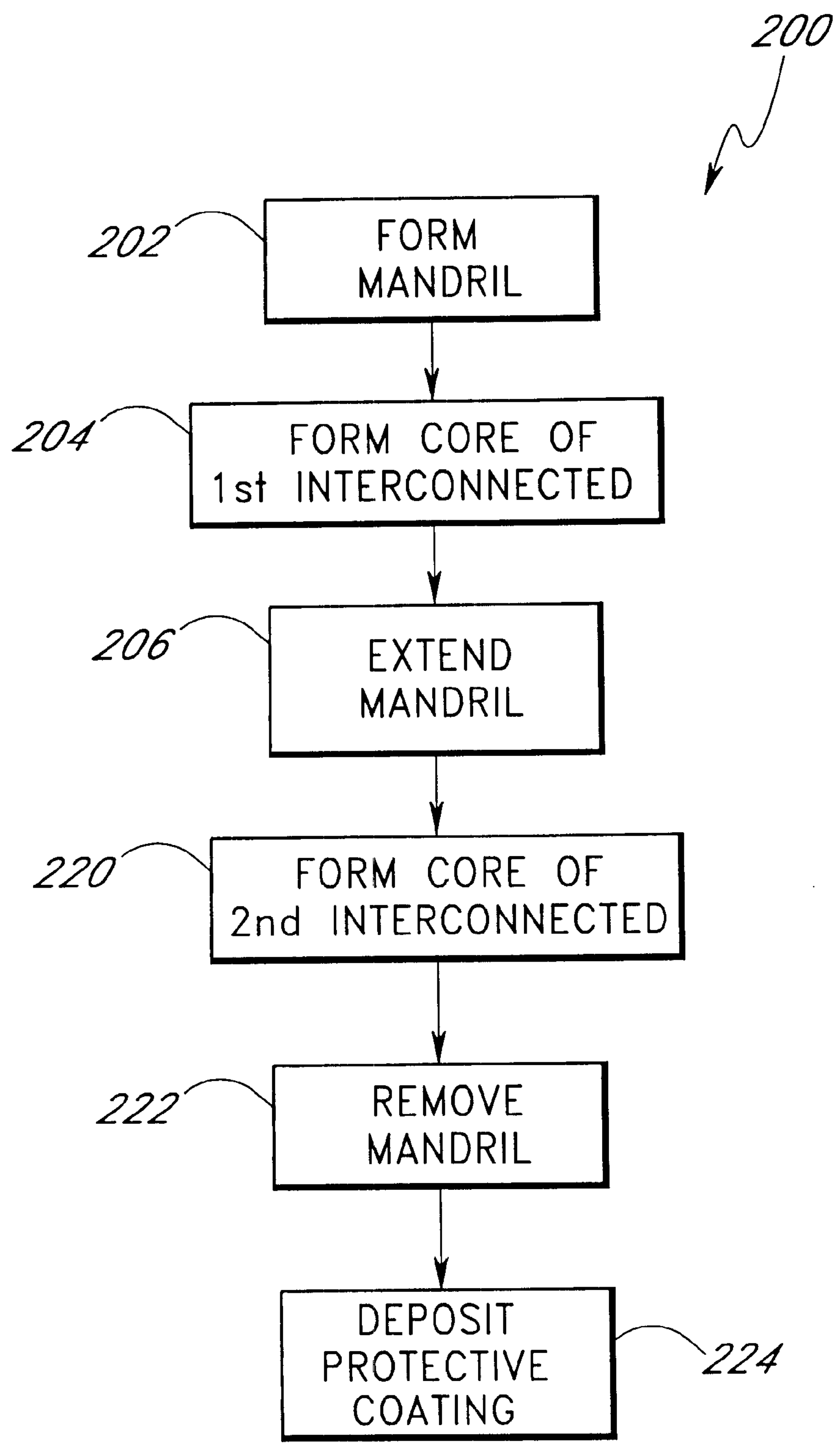
FIG. 6 is a flow chart illustrating a method of forming adjacent electrical interconnects having overlapping air bridge sections.
Figure 7:
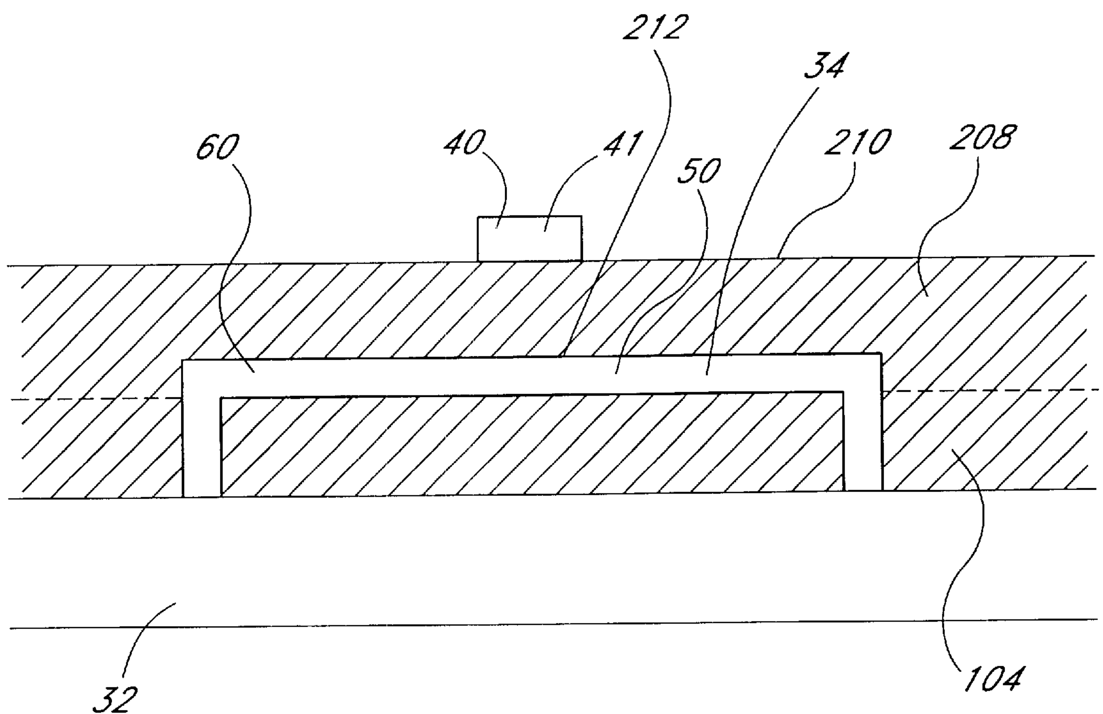
FIGS. 7 is a cross-sectional schematic diagram illustrating the electrical interconnects of FIG. 1 in a partially fabricated state according to the method of FIG. 6.

Reference will now be made to FIGS. 6–7 which illustrate a method 200 of forming a plurality of adjacent electrical interconnects having overlapping air bridge sections in accordance with yet another embodiment of the present invention. As shown in FIG. 6, the method 200 comprises forming the mandril 104 in a state 202, and forming the core 60 of the first interconnect 34 above the mandril in a state 204 in the manner described above in connection with FIG. 4.

As shown in FIGS. 6 and 7, The method further comprises, in a state 206, extending the mandril 104 with a second photoresist layer 208 that covers the core 60 of bridge section 50 of the first interconnect. The purpose of the second layer 208 is to support and elevate a core 41 of the second interconnect 40 above the first core 60. The second layer 208 includes an upper surface 210 which is displaced above an upper surface 212 of the first core 60. The thickness of the second layer 208 is selected so as to provide a desired distance between the upper surface 212 of the first core 60 and the upper surface 210 of the second photoresist layer 208.

As shown in FIG. 6, the method further comprises forming the second interconnect 40, in a state 220, so that the second interconnect 40 extends between the third and fourth circuit nodes 42 and 44, of the integrated circuit (FIGS. 2 and 3). The second interconnect 40 is preferably formed using the methods described above in connection with FIG. 4; i.e. forming vias in the mandril layers 104, 208, depositing a layer of conducting material over the mandril, and patterning the conducting material. Furthermore, the overlapping core 41 of the second interconnect 40 preferably extends along a direction that is perpendicular to that of the first interconnect 34 and 40 so as to reduce capacitive coupling between the first and second interconnects.

As shown in FIG. 6, the method further comprises, in a state 222, removing the mandril. In one embodiment, removing the mandril comprises removing the mandril layers 104 and 208 after completing the cores 60 and 41 of the respective electrical interconnects 34 and 40. In particular, after forming the first and second cores 60 and 41, the first and second photoresist layers 104 and 208 are removed in a single etching process. However, it will be appreciated that, in another embodiment, the first mandril layer 104 could be removed subsequent to forming the first core 60 in a first etching process and the second mandril layer 208 could be removed in a separate second etching process subsequent to forming the second core 41.

As shown in FIG. 6, the method 200 further comprises depositing the protective coating 62 in a state 224. In one embodiment, the protective coating 62 is simultaneously deposited on the cores 60 and 41 of the first and second interconnects 34 and 40 in the manner described above in connection with FIG. 4. The advantage of simultaneously depositing the coating on both cores 60 and 41 is that fewer processing steps are needed. However, it will be appreciated that each of the cores 60 and 41 could be coated during separate deposition stages without departing from the spirit of the present invention.

It will be appreciated that the electrical interconnect and methods for providing the same of the present invention provide many advantages. In particular, because the interconnect includes the air bridge which is surrounded by air, the interconnect is provided with a reduced capacitance. Consequently, the interconnect is less susceptible to the problems of signal delay and signal cross-talk. Furthermore, because the core of the air bridge is formed of highly conductive material, the air bridge is able to have a reduced resistance, thereby further reducing signal delays. Moreover, because the core of the air bridge is formed of a material having a relatively low ratio of $\rho/E$, the air bridge is less susceptible to the problems of sagging. Thus, the air bridge is less likely to fracture and/or contact adjacent structures of the integrated circuit, thereby allowing adjacent interconnects to be spaced more closely together and span larger distances. Additionally, because the core of the air bridge is surrounded by the protective coating, oxygen from the air surrounding the air bridge is inhibited from reacting with the core which would otherwise contaminate the core which could possibly increase the resistance of the core and decrease the mechanical strength of the core.

Although the preferred embodiment of the present invention has shown, described and pointed out the fundamental novel features of the invention as applied to this embodiment, it will be understood that various omissions, substitutions and changes in the form of the detail of the device illustrated may be made by those skilled in the art without departing from the spirit of the present invention. Consequently, the scope of the invention should not be limited to the foregoing description, but should be defined by the appending claims.

What is claimed is:

1. An electrical interconnect of an integrated circuit for electrically connecting first and second nodes of the integrated circuit wherein the integrated circuit includes a plurality of interconnects, the electrical interconnect comprising a bridge supported at a first and second end such that gravitational forces acting on the bridge cause the bridge to sag, the bridge disposed adjacent a gaseous medium so as to reduce the capacitance of the interconnect, the bridge comprising a conductive core that includes a material which has a tendency to become contaminated by the gaseous medium, the bridge further comprising a protective coating covering a substantial portion of the core so as to inhibit the core from being contaminated by the gaseous medium wherein the conductive core is isolated from adjacent interconnects of the integrated circuit by the protective coating and the gaseous medium.

2. The interconnect of claim 1, wherein the material of the conductive core has a resistivity less than that of aluminum.

3. The interconnect of claim 2, wherein the material of the conductive core has a ratio of mass density over modulus of elasticity (ρ/E) less than that of gold.

4. The interconnect of claim 3, wherein the conductive core comprises copper.

5. The interconnect of claim 4, wherein a substantial portion of the core is formed of copper.

6. The interconnect of claim 3, wherein the core comprises silver.

7. The interconnect of claim 6, wherein a substantial portion of the core is formed of silver.

8. The interconnect of claim 1, wherein the protective coating comprises a conducting material.

9. The interconnect of claim 8, wherein the conducting material of the protective coating has a relatively low solubility with respect to the core.

10. The interconnect of claim 9, wherein the conducting material of the protective coating is selected from the group consisting of gold, platinum, palladium, iridium, titanium, zirconium, hafnium, chromium, and vanadium.

11. The interconnect of claim 1, wherein the protective coating comprises an insulating material.

12. The interconnect of claim 11, wherein the insulating material of the protective coating has a relatively low solubility with respect to the core.

13. The interconnect of claim 12, wherein the insulating material of the protective coating is an organic insulating material.

14. The interconnect of claim 13, wherein the insulating material of the protective coating comprises parylene.

15. The interconnect of claim 12, wherein the insulating material of the protective coating is an inorganic insulating material.

16. The interconnect of claim 15, wherein the insulating material of the protective coating comprises $Si_3N_4$.

17. The interconnect of claim 1, wherein the gaseous medium comprises air.

18. An integrated circuit having a plurality of circuit nodes, the integrated circuit comprising:

a first interconnect providing a first conducting path between first and second circuit nodes, the first interconnect comprising a first air bridge extending through an air space comprising a gaseous medium, the first air bridge comprising an inner core that includes a first material selected to provide the first air bridge with a resistance substantially less than that of aluminum and a mass density substantially less than that of gold, the first air bridge further comprising a protective coating that includes a second material selected to inhibit oxygen from diffusing therein, wherein the protective coating substantially surrounds the core and inhibits oxygen from the air space from contaminating the core; and a second interconnect providing a second conducting path between third and fourth circuit nodes, the second interconnect comprising a second air bridge comprising an inner core and a protective coating that substantially surrounds the core the second air bridge extending through the air space so that the second air bridge is disposed adjacent the first air bridge wherein the conductive core in both the first and second interconnects are isolated from each other by the protective coating and the gaseous medium.

19. The integrated circuit of claim 18, wherein the first material is selected from the group consisting of copper and silver.

20. The integrated circuit of claim 19, wherein the second material is selected from the group consisting of gold, platinum, palladium, iridium, titanium, zirconium, hafnium, chromium, vanadium, parylene, and $Si_3N_4$.

* * * * *

UNITED STATES PATENT AND TRADEMARK OFFICE

CERTIFICATE OF CORRECTION

PATENT NO. : 6,433,431 B1
DATED : August 13, 2002
INVENTOR(S) : Paul A. Farrar

It is certified that error appears in the above-identified patent and that said Letters Patent is hereby corrected as shown below:

Column 11,
Line 12, please delete "includes" and insert therefor, -- induces --, Signed and Sealed this Eighth Day of July, 2003

JAMES E. ROGAN
*Director of the United States Patent and Trademark Office*